(12) United States Patent
Marin et al.

(10) Patent No.: US 11,158,444 B2
(45) Date of Patent: Oct. 26, 2021

(54) MAGNETIC MATERIAL HAVING COATED FERROMAGNETIC FILLER PARTICLES

(71) Applicant: INTEL CORPORATION, Santa Clara, CA (US)

(72) Inventors: Brandon C. Marin, Chandler, AZ (US); Frank Truong, Gilbert, AZ (US); Shivasubramanian Balasubramanian, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 15/894,418

(22) Filed: Feb. 12, 2018

(65) Prior Publication Data

US 2019/0252102 A1 Aug. 15, 2019

(51) Int. Cl.
| | |
|---|---|
| *H01F 1/20* | (2006.01) |
| *H01F 27/28* | (2006.01) |
| *H01L 23/00* | (2006.01) |
| *H01L 23/64* | (2006.01) |
| *H01L 23/498* | (2006.01) |
| *H01F 17/00* | (2006.01) |

(52) U.S. Cl.
CPC ........... *H01F 1/20* (2013.01); *H01F 17/0013* (2013.01); *H01F 17/0033* (2013.01); *H01F 27/2804* (2013.01); *H01L 23/49838* (2013.01); *H01L 23/645* (2013.01); *H01L 24/16* (2013.01); *H01F 2027/2809* (2013.01); *H01L 2224/16227* (2013.01); *H01L 2924/19042* (2013.01); *H01L 2924/19103* (2013.01)

(58) Field of Classification Search
CPC .................. H01F 1/20; H01F 27/2804; H01F 2027/2809; H01L 23/49838; H01L 23/645; H01L 24/16; H01L 2924/19042; H01L 2224/16227; H01L 2924/19103
USPC ........................................................ 257/668
See application file for complete search history.

(56) References Cited

U.S. PATENT DOCUMENTS

| | | | |
|---|---|---|---|
| 8,920,670 B2 * | 12/2014 | Harada | H01F 1/33 252/62.55 |
| 8,988,301 B2 * | 3/2015 | Yonetsu | H01F 41/0246 343/787 |

OTHER PUBLICATIONS

Kim, J. et al., "Multifunctional uniform nanoparticles composed of magnetite nanocrystal core and a mesoporous silica shell for magnetic resonance and fluorescence imaging and for drug delivery", Angew. Chemie—Int. Ed.,vol. 47, No. 44; 2008.
Li, J.F. et al., "Shell-Isolated Nanoparticle-Enhanced Raman Spectroscopy (SHINERS)", Front. Surface-Enhanced Raman Scatt. Single Nanoparticles Single Cells, 464, 163-192, 2014.

* cited by examiner

*Primary Examiner* — Vu A Vu
(74) *Attorney, Agent, or Firm* — Essential Patents Group LLP.

(57) ABSTRACT

A magnetic material may be fabricated with a plurality of magnetic filler particles dispersed within a carrier material, wherein at last one of the magnetic filler particles may comprise a ferromagnetic core coated with an inert material to form a shell surrounding the ferromagnetic core. Such a coating may allow for the use of ferromagnetic materials for forming embedded inductors in package substrates without the risk of being incompatible with fabrication processes used to form these package substrates.

22 Claims, 4 Drawing Sheets

MAGNETIC MATERIAL HAVING COATED FERROMAGNETIC FILLER PARTICLES

TECHNICAL FIELD

Embodiments of the present description generally relate to the field of electronic materials and devices and, more particularly, to magnetic materials having coated ferromagnetic filler particles in a carrier material that may be used to form inductors in package substrates.

BACKGROUND ART

The integrated circuit industry is continually striving to produced ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize the current in the integrated circuit devices. As will be understood to those skilled in the art, inductors are passive electrical components that store energy in a magnetic field generated by a magnetic material and are generally standalone components that are electrically attached to the integrated circuit devices. In order to produced faster and smaller integrated circuit devices, these inductors may be embedded in package substrates, wherein the package substrates are used to route electrical signals for active and passive components in the integrated circuit devices. However, embedding inductors may require the use of magnetic films, pastes, and inks formed from magnetic filler particles disposed in a polymer carrier. The magnetic filler particles are generally ferromagnetic materials, such as iron-based magnetic particles, which may be electrically conductive. This electrical conductivity may interfere with signal integrity and may promote crosstalk and shorts. Furthermore, ferromagnetic materials, particularly iron-based magnetic particles, may be incompatible with fabrication processes, such as electroless and electrolytic deposition processes, because these materials may contaminate the deposition baths and interfere with the deposition kinetics, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
FIGS. 1-3 illustrate side cross-sectional views of a method of embedding a magnetic material structure within a plurality of dielectric structures, wherein the magnetic material structure includes coated, ferromagnetic particles dispersed within a carrier material, according to various embodiments of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as may be used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have a relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in microelectronic packages and dies. The term "solder pad" may be occasionally substituted for "bond pad", and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include a magnetic material comprising a plurality of ferromagnetic particles dispersed within a carrier material, wherein at last one of the ferromagnetic particles may be coated with an inert material to form a shell surrounding the ferromagnetic particles. Further embodiments may include inductors formed from such a magnetic material. Still further embodiments may include incorporating the inductor of the present description into a package substrate and may further include forming an integrated circuit package by attaching at least one integrated circuit device to the package substrate.

Figure 2:
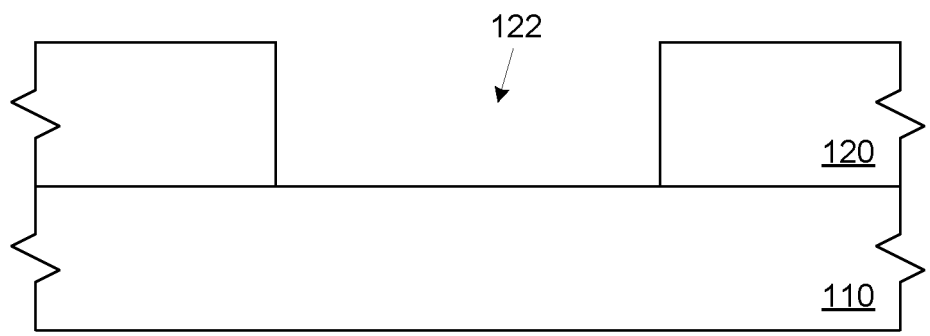

As shown in FIG. 1, a dielectric structure 120, such as a layer, may be formed on a dielectric structure 110, such as a layer, by any technique known in the art, including, but not limited to, lamination and deposition techniques. As shown in FIG. 2, at least one opening 122 may be formed through the dielectric structure 120. The opening 122 may be formed by any technique known in the art, including, but not limited to lithography, laser ablation, and ion bombardment.

Figure 3:
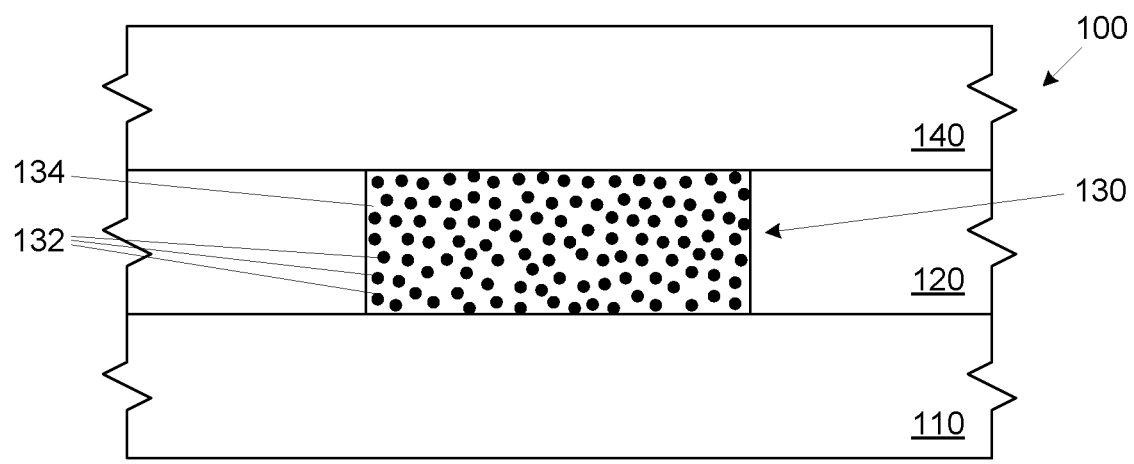

As shown in FIG. 3, a magnetic material structure 130 may be formed by disposing a magnetic material into the at least one dielectric opening 122 (see FIG. 2), by any technique known in the art, including, but not limited to deposition and lamination. As further shown in FIG. 3, a dielectric structure 140, such as a layer, may be formed over the dielectric structure 120 and the magnetic material structure 130 to embed the magnetic material structure 130, thereby forming at least a portion of a package substrate 100. The magnetic material structure 130 may comprise magnetic filler particles 132 within a carrier material 134. The carrier material 134 may be any appropriate material, such as polymer resins, including, but not limited to, acrylates, polyimides, polyesters, polypropylenes, and cyclic olefin polymers. In one embodiment, the carrier material 134 may comprise an epoxy.

Figure 4:
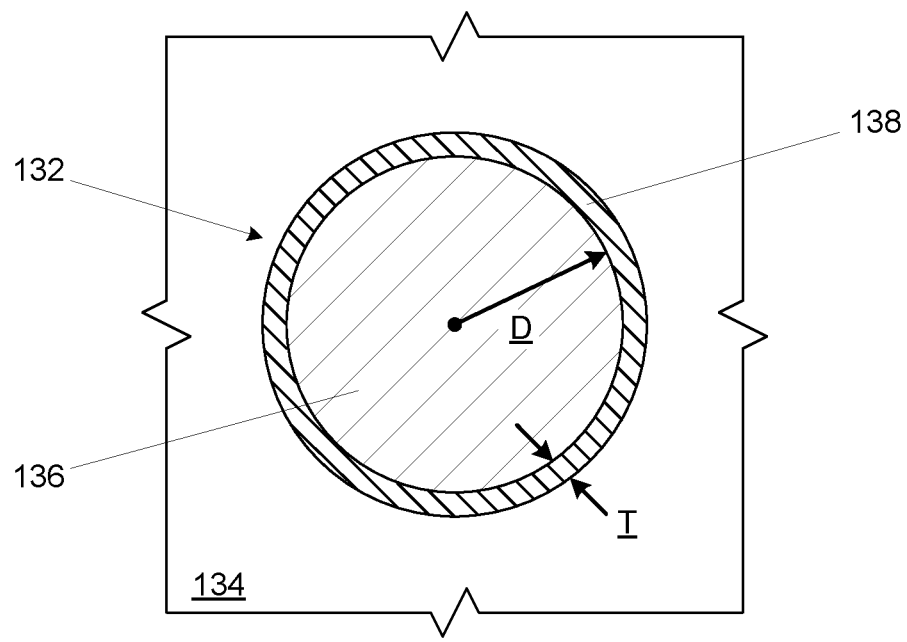
FIG. 4 illustrates side cross-sectional views of a single coated, ferromagnetic particle within a carrier material, according to one embodiment of the present description.

FIG. 4 illustrates a cross-sectional view of a single magnetic filler particle 132. The magnetic filler particles 132 may each comprise a magnetic core 136 surrounded by or "coated" with a shell 138. The magnetic core 136 may be any appropriate ferromagnetic material, such as high-permeability ferromagnetic material. The term "permeability" relates to the measure of the ability of a material to support a magnetic field, as will be understood to those skilled in the art, and is defined as a reference permeability, wherein the permeability of the material is divided by the permeability of free space, i.e. $\mu/\mu_0$. The term "effective permeability" is defined to mean the permeability of the combination of the magnetic core 136 and the shell 138. The term "high-permeability magnetic filler particle" is defined to mean a magnetic filler particle having an effective permeability of greater than about 4, and in one embodiment of the present description, at least one of the magnetic filler particles 132 of the magnetic material structure 130 may have an effective permeability of greater than about 4. In a specific embodiment, at least one of the magnetic filler particles 132 may have an effective permeability of between about 4 and 2400. In one embodiment, the magnetic core 136 may comprise iron, including, but not limited to substantially pure iron, iron alloys, iron ceramics, iron carbides, and the like. In other embodiments, the magnetic core 136 may comprise a nickel, including, but not limited to substantially pure nickel, nickel alloys, and nickel ceramics. In a further embodiment, the magnetic core 136 may comprise a cobalt tantalum zirconate.

In one embodiment, the magnetic core 136 may have a diameter D of between about 0.05 and 50 microns. In a specific embodiment, the magnetic core 136 may have a diameter D of between about 1 and 10 microns.

The shell 138 may comprise any appropriate inert material. The term "inert" is defined to mean that the material is chemically inert or substantially non-reactive to materials and chemicals used in subsequent processing. In one embodiment, the shell 138 may be sufficient thin, such that the magnetic properties of the magnetic core 136 are maintained. In other words, the shell 138 should be thick enough to serve as a barrier between materials used in subsequent processing, such as wet chemistry, and the magnetic core 136, but does not interfere with the magnetic fields generated by the magnetic core 136. The shell 138 may be any appropriate material that achieves these goals. In an embodiment, the shell 138 may be a substantially electrically non-conductive material and/or wet etch resistant, including, but not limited to, silica, silicon nitride, fluorinated polymer, alumina, and aluminum nitride. In one embodiment, a thickness T of the shell 138 may be between 5 and 50 nanometers. In another embodiment, the magnetic filler particles 132 comprise between about 50% to 85% by weight of the magnetic material structure 130. In one embodiment, the shell 138 may have a permeability that is lower than the permeability of the magnetic core 136.

Although the magnetic core 136 is illustrated as a sphere in the embodiment of FIG. 4, the embodiments of the present description are not so limited. For example, in some embodiments, the magnetic core 136 may be cylindrical shaped, discoidal shaped, tabular shaped, ellipsoidal shaped, equant shaped, and the like (not shown).

Figure 5:
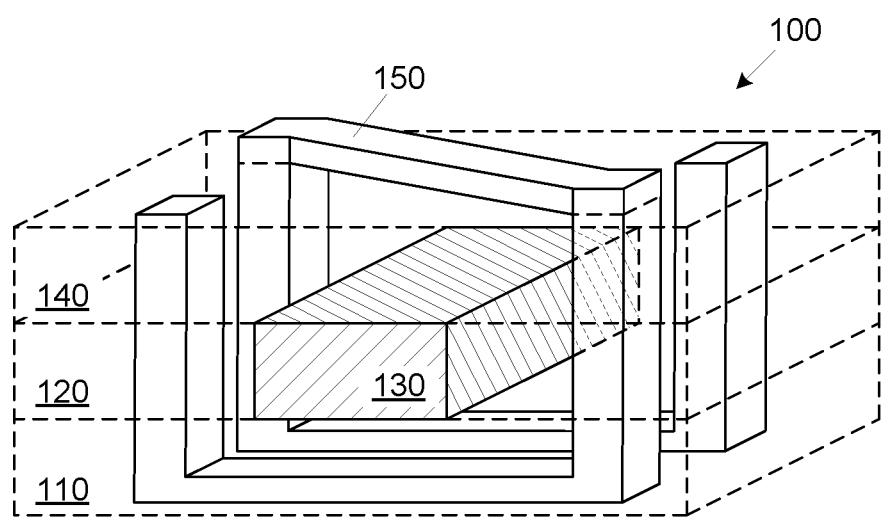
FIG. 5 illustrates an orthogonal view of an inductor embedded in a package substrate, wherein the package substrate is electrically attached to an electronic board and wherein an integrated circuit device is electrically attached to the package substrate, according to an embodiment of the present description.

As shown in FIG. 5 in oblique view, an inductor 160 may be formed by forming an inductor metallization 150 in the shape of a spiral around the magnetic material structure 130 on and through the dielectric structures 110, 120, and 140 (shown in shadow lines). The processes for the formation of such an inductor metallization 150 is well known in the art and for the sake of brevity and conciseness will not be described herein. It is further understood that the inductor 160 of FIG. 5 is merely exemplary, as an inductor 160 may be made in a myriad of configurations. In various configurations, if the magnetic material structure 130 is dielectric, a portion of the inductor metallization 150 may extend through the magnetic material structure 130 (not shown).

Figure 6:
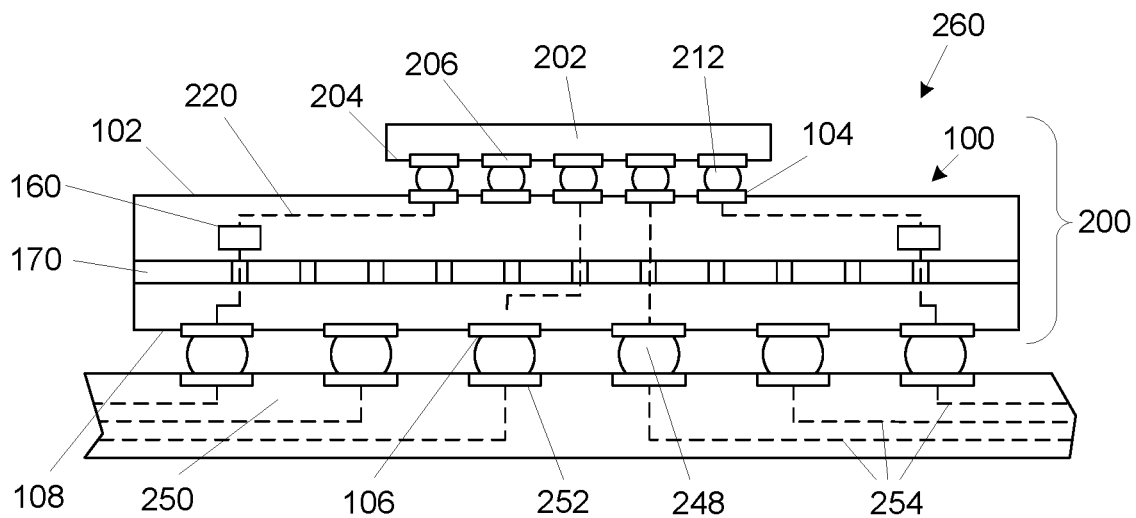
FIG. 6 illustrates a side cross-sectional view of an inductor embedded in a package substrate, wherein the package substrate is electrically attached to an electronic board and wherein an integrated circuit device is electrically attached to the package substrate, according to an embodiment of the present description.

As shown in FIG. 6, in one embodiment of the present description, the package substrate 100 of FIG. 3 may have an integrated circuit device 202, such as a microprocessor, a chipset, a graphics device, a wireless device, a memory device, an application specific integrated circuit, or the like, attached thereto to form an electronic package 200. The integrated circuit device 202 may be attached to a first surface 102 of the package substrate 100 through a plurality of interconnects 212, such as solder bumps. The device-to-substrate interconnects 212 may extend between bond pads 206 on a first surface 204 of the integrated circuit device 202 and substantially mirror-image bond pads 104 on the package substrate first surface 102. The integrated circuit device bond pads 206 may be in electrical communication with integrated circuitry (not shown) within the integrated circuit device 202.

The electronic package 200 may be attached to an electronic board 250, such as a motherboard, through a plurality of interconnects 248, such as solder bumps, to form an electronic structure 260. The package-to-board interconnects 248 may extend between bond pads 106 on a second surface 108 of the package substrate 100 and substantially mirror-image bond pads 252 on the electronic board 250. The bond pads 252 of the electronic board 250 may be in electrical communication with board communication routes (illustrated as dashed lines 254), which may be in electrical communication with components (not shown) external to the electronic package 200.

The package substrate bond pads 106 may be in electrical communication with electrical communication routes (illustrated as dashed lines 220 within the package substrate 100). These electrical communication routes 220 may form electronic contact between the electronic board 250 and the integrated circuit device 202, which may include electrical contact with the inductor 160 within the package substrate 100.

When solder balls or bumps are used to form the device-to-substrate interconnects 212 and/or the package-to-board interconnects 248, the solder may be any appropriate material, including, but not limited to, lead/tin alloys and high tin content alloys (e.g. about 90% or more tin), and similar alloys. The solder may be reflowed, either by heat, pressure, and/or sonic energy. Although the device-to-substrate interconnects 212 are shown as reflowable solder bumps or balls, they may be pins, lands, or wire bonds, as known in the art.

The electrical communication routes 220 may be made of multiple layers of conductive traces, such as copper or aluminum, built up on and through dielectric layers, which are laminated on either side of a substrate core 170. The board communication routes 254 may be made of multiple layers of conductive traces, such as copper or aluminum, built up on and through dielectric layers, as will be understood to those skilled in the art. Although the package substrate 100 is shown as having the substrate core 170, it may also be a coreless substrate, as will be understood to those skilled in the art.

Figure 7:
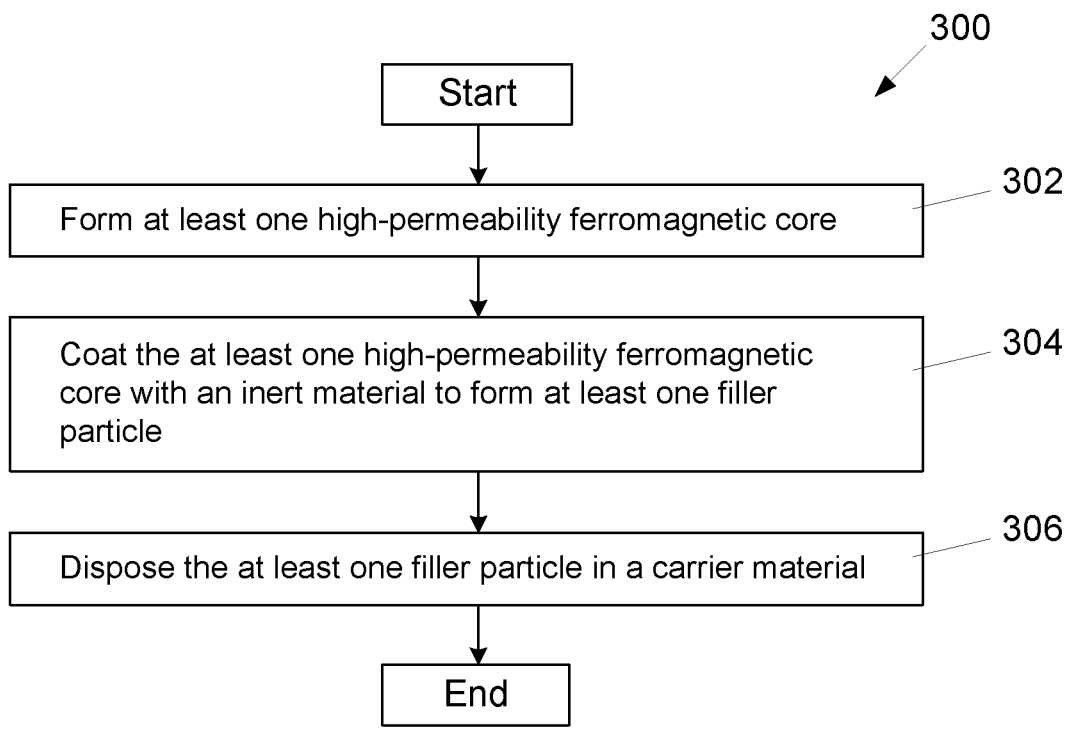
FIG. 7 is a flow chart of a process of fabricating an integrated circuit package, according to an embodiment of the present description.

FIG. 7 is a flow chart of a process 300 of fabricating a magnetic material, according to the various embodiments of the present description. As set forth in block 302, at least one high-permeability ferromagnetic core may be formed. The at least one high-permeability ferromagnetic core may be coated with an inert material to form at least one filler particle, as set forth in block 304. As set forth in block 306, the at least one filler particle may be disposed in a carrier material.

Figure 8:
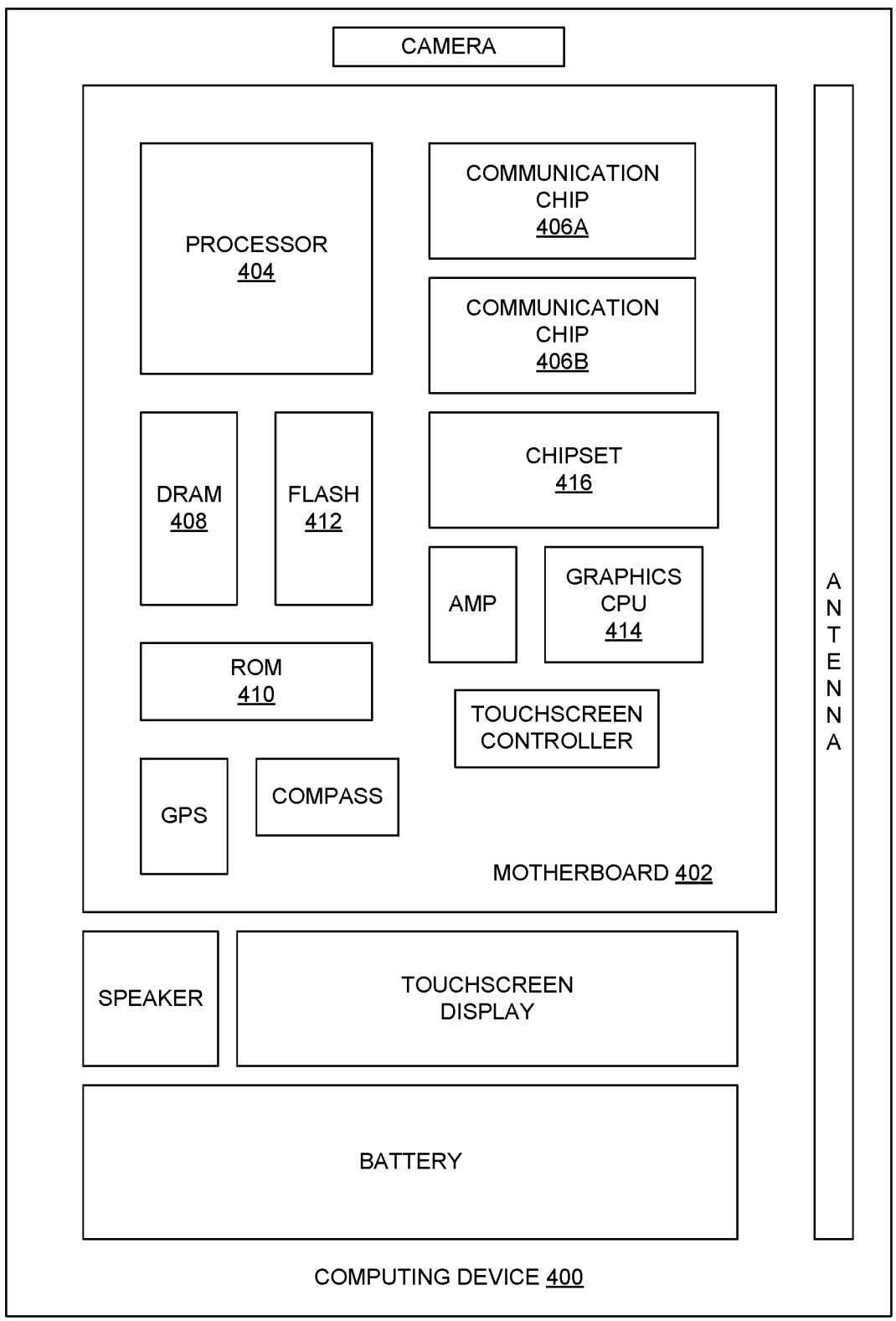
FIG. 8 illustrates an electronic system/device, according to one implementation of the present description.

FIG. 8 illustrates an electronic system or computing device 400 in accordance with one implementation of the present description. The computing device 400 may house a board 402. The board 402 may include a number of integrated circuit components attached thereto, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others The term "processor" may refer to any device or portion of a device that processes electronic data from registers and/or memory to transform that electronic data into other electronic data that may be stored in registers and/or memory.

Any of the integrated circuit components within the computing device 400 may include an inductor embedded in an package substrate, wherein the inductor comprises a magnetic material structure comprising a carrier material and a plurality of magnetic filler particles within the carrier material, wherein at least one magnetic filler particle of the plurality of magnetic filler particles comprises a magnetic core and a shell surrounding the magnetic core and wherein at least one magnetic filler particle of the plurality of magnetic filler particles has an effective permeability of greater than about 4

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit device and assembly applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic structure, comprising;
a substrate having at least one dielectric structure comprising a first dielectric structure, a second dielectric structure, and a third dielectric structure; and
an inductor embedded in the at least one dielectric structure, wherein the inductor comprises:
an inductor metallization contacting the first dielectric structure, the second dielectric structure, and the third dielectric structure, and
a magnetic material structure contacting the first dielectric structure, the second dielectric structure, and the third dielectric structure, wherein the magnetic material structure comprises a carrier material and a plurality of magnetic filler particles within the carrier material, wherein at least one magnetic filler particle comprises a magnetic core and a shell surrounding the magnetic core, wherein the magnetic core comprises a ferromagnetic material, and wherein the at least one magnetic filler particle has an effective permeability of greater than about 4.

2. The electronic structure of claim 1, wherein the ferromagnetic material comprises iron.

3. The electronic structure of claim 1, wherein the at least one magnetic filler particle of the plurality of magnetic filler particles has an effective permeability of between about 4 and 2400.

4. The electronic structure of claim 1, wherein the shell comprises an electrically non-conductive material.

5. The electronic structure of claim 1, wherein the shell comprises an inert material.

6. The electronic structure of claim 5, wherein the inert material comprises silica.

7. The electronic structure of claim 1, wherein the carrier material comprises a polymer resin.

8. The electronic structure of claim 7, wherein the polymer resin comprises epoxy.

9. The electronic structure of claim 1, wherein the magnetic core is substantially spherical.

10. The electronic structure of claim 9, wherein the magnetic core has a diameter of between about 1 and 10 microns.

11. The electronic structure of claim 1, wherein the shell has a thickness of between about 5 and 50 nm.

12. An electronic system, comprising:
a board; and
an electronic package attached to the board, wherein the electronic package comprises:
  a package substrate having at least one dielectric structure comprising a first dielectric structure, a second dielectric structure, and a third dielectric structure;
  at least one microelectronic device attached to the package substrate; and
an inductor embedded in the at least one dielectric structure of the package substrate, wherein the inductor comprises:
  an inductor metallization contacting the first dielectric structure, the second dielectric structure, and the third dielectric structure, and
  a magnetic material structure contacting the first dielectric structure, the second dielectric structure, and the third dielectric structure, wherein the magnetic material structure comprises a carrier material and a plurality of magnetic filler particles within the carrier material, wherein at least one magnetic filler particle comprises a magnetic core and a shell surrounding the magnetic core, wherein the magnetic core comprises a ferromagnetic material, and wherein the at least one magnetic filler particle has an effective permeability of greater than about 4.

13. The electronic system of claim 12, wherein the ferromagnetic material comprises iron.

14. The electronic system of claim 12, wherein the at least one magnetic filler particle of the plurality of magnetic filler particles has an effective permeability of between about 4 and 2400.

15. The electronic system of claim 12, wherein the shell comprises an electrically non-conductive material.

16. The electronic system of claim 12, wherein the shell comprises an inert material.

17. The electronic system of claim 16, wherein the inert material comprises silica.

18. The electronic system of claim 12, wherein the carrier material comprises a polymer resin.

19. The electronic system of claim 18, wherein the polymer resin comprises epoxy.

20. The electronic system of claim 12, wherein the magnetic core is substantially spherical.

21. The electronic system of claim 20, wherein the magnetic core has a diameter of between about 1 and 10 microns.

22. The electronic system of claim 12, wherein the shell has a thickness of between about 5 and 50 nm.

* * * * *